(12) United States Patent
Apsel et al.

(10) Patent No.: US 10,530,414 B2
(45) Date of Patent: Jan. 7, 2020

(54) SIGNAL PROCESSING DEVICE, AMPLIFIER, AND METHOD

(71) Applicant: Cornell University, Ithaca, NY (US)

(72) Inventors: Alyssa Apsel, Trumansburg, NY (US); Alyosha Molnar, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 15/028,232

(22) PCT Filed: Oct. 14, 2014

(86) PCT No.: PCT/US2014/060531
§ 371 (c)(1),
(2) Date: Apr. 8, 2016

(87) PCT Pub. No.: WO2015/054699
PCT Pub. Date: Apr. 16, 2015

(65) Prior Publication Data
US 2016/0261304 A1 Sep. 8, 2016

Related U.S. Application Data

(60) Provisional application No. 61/890,022, filed on Oct. 11, 2013.

(51) Int. Cl.
*H04B 1/52* (2015.01)
*H03F 3/193* (2006.01)
(Continued)

(52) U.S. Cl.
CPC ............... *H04B 1/52* (2013.01); *H03F 3/193* (2013.01); *H03F 3/245* (2013.01); *H04B 1/0475* (2013.01);
(Continued)

(58) Field of Classification Search
None
See application file for complete search history.

(56) References Cited

U.S. PATENT DOCUMENTS

| 8,620,254 B2 | 12/2013 | Molnar |
| 2007/0182481 A1* | 8/2007 | Wu .......................... H03F 3/602 330/54 |

(Continued)

FOREIGN PATENT DOCUMENTS

FR 2895150 A1 6/2007

OTHER PUBLICATIONS

Sewter et al., A CMOS Finite Impulse Response Filter With a Crossover Traveling Wave Topology for Equalization up to 30 Gb/s, IEEE Journal of Solid-State Circuits, vol. 41, No. 4, pp. 909-917. Apr. 1, 2006.

(Continued)

*Primary Examiner* — Yemane Mesfin
*Assistant Examiner* — Jeff Banthrongsack
(74) *Attorney, Agent, or Firm* — Hodgson Russ LLP

(57) ABSTRACT

An active electronic device that enables bidirectional communication over a single antenna or path is disclosed. The device may be characterized by a forward path (from an input to an antenna port) offering high gain, and a reverse path (to a receiver port) that can be configured as an finite impulse response ("FIR") filter. An amplifier of the device is disclosed, the amplifier allowing for tuning of output resistance using passive mixers.

18 Claims, 5 Drawing Sheets

(51) Int. Cl.
   *H03F 3/24*   (2006.01)
   *H04B 1/04*   (2006.01)
   *H04L 5/14*   (2006.01)

(52) U.S. Cl.
   CPC .......... *H04L 5/14* (2013.01); *H03F 2200/451* (2013.01); *H03F 2200/75* (2013.01)

(56) References Cited

U.S. PATENT DOCUMENTS

| | | | |
|---|---|---|---|
| 2007/0247257 A1* | 10/2007 | Shastry | H03F 3/605 333/132 |
| 2008/0079648 A1* | 4/2008 | Forstner | H01P 1/213 343/850 |
| 2008/0284487 A1* | 11/2008 | Pullela | H03D 7/1441 327/355 |

OTHER PUBLICATIONS

Leisten et al., Distributed amplifiers as duplexerlcirculator components at S-band, pp. 5/1-5/4. Jan. 1, 1988.

Andrews et al., Implications of Passive Mixer Transparency for Impedance Matching and Noise Figure in Passive Mixer-First Receivers, IEEE Transactions on Circuits and Systems I, vol. 57, Iss. 12, pp. 3092-3103. Jul. 23, 2010.

Andrews et al., A passive-mixer-first receiver with baseband-controlled RF impedance matching, 6dB NF, and 27dBm wideband IIP3, IEEE International Solid-State Circuits Conference, pp. 46-47. Feb. 1, 2010.

\* cited by examiner

SIGNAL PROCESSING DEVICE, AMPLIFIER, AND METHOD

CROSS-REFERENCE TO RELATED APPLICATIONS

This application claims priority to U.S. Provisional Application No. 61/890,022, filed on Oct. 11, 2013, the disclosure of which is incorporated herein by reference.

FIELD OF THE DISCLOSURE

The disclosure relates to radio frequency signal processing devices, and more particularly to diplexers for radio frequency signals.

BACKGROUND OF THE DISCLOSURE

With imaging and video applications driving an ever increasing appetite for wireless bandwidth, the need for spectrally efficient technologies that utilize available whitespace is apparent. Fast hopping, multiple-in and multiple-out ("MIMO"), and cognitive radio networks further exacerbate the problem, requiring full concurrent cooperation and tight closed loop control between transceivers across a flexible range of frequencies. Rapid development of new wireless signaling methods and standards also demands flexible hardware that can adapt to these changes.

Radio Frequency ("RF") duplexers and diplexers are great assets in these systems, as they allow bidirectional communication either on the same band or over adjacent bands over the same path, enabling a transmitter and a receiver to share an antenna while transceiver communicating with minimal round-trip latency. Duplexers and diplexers preferably isolate the transmitter and receiver such that the receiver and transmitter do not load each other, the noise from the transmitter does not corrupt the receive signal, and the receiver is not desensitized (or damaged) by the high-power transmitted signal.

Previous diplexers rely on high-Q frequency selective filters to provide isolation, and/or ferrite structures such as circulators, preventing their integration in CMOS and increasing cost, size, and weight. Alternative approaches, using "electrical balance," employ high-Q transformers to try to overcome this limitation, but this severely limits tunability to a narrow range of frequencies. And, the use of resonant, transformer structures to generate cancellation of the transmit signal at the receiver input suffers from intrinsic losses, degrading transmitter efficiency, and receiver noise performance. Finally, all of these approaches are narrow band and largely un-tunable, only providing isolation between receiver and transmitter across a frequency range of less than one octave.

An advantageous RF front would be fully integrated on chip with a single antenna port, would support simultaneous reception and transmission of RF signals, and would provide significant flexibility (i.e., multiple octaves) in center frequency and bandwidth of both receiver and transmitter. An active duplexer circuit capable of significant signal and noise isolation was demonstrated, however, the transmit power was limited to only 10's of microwatts. A truly useful system should meet these same requirements of isolation, integration and flexibility, while transmitting four orders of magnitude more power. No such system exists today.

BRIEF SUMMARY OF THE DISCLOSURE

An active electronic circuit that enables bidirectional communication over a single antenna or path is disclosed. The disclosed circuit has a topology similar to that of a distributed amplifier, but provides tunable gain cells. The forward path through the amplifier (from input to output) offers high gain. The reverse path, from input to the receiver port, can be configured as an finite impulse response ("FIR") filter by programming the gain cells to represent the weights of the filter, while LC sections of input and output lines implement the delay or sampling time of the filter. The circuit also provides for tuning of the output resistance using passive mixers.

Embodiments of the disclosure enable wideband RF duplexing using a circuit that may be realized in an integrated fashion. The circuit effectively isolates a high-power RF transmitted signal from a co-integrated receiver, allowing the two circuits to share the same antenna and the same frequency band without interfering with each other. The receiver is able to handle the transmitter power and is not affected by TX noise because it is placed on a port where the signal from the TX is effectively filtered by the circuit's FIR filter behavior. This advantageously enables a radio to communicate continuously and bi-directionally, with frequencies across octaves, using a single antenna—typically an expensive and physically large portion of a radio transceiver system.

Embodiments of the present disclosure can advantageously:
  (a) be entirely realized on a single chip in a CMOS/BiCMOS process;
  (b) have wideband and tunable characteristics (can operate over a wide frequency range);
  (c) provide very high isolation between ports 2 and 3 (FIG. 1); and
  (d) provide very low noise transfer to port 2.

The disclosure may be embodied as a distributed signal processing device. The signal processing device comprises a plurality of gain cells, each gain cell has an input and an output. Each gain cell amplifies an electrical signal received at the input by a reconfigurable gain A. The device has a plurality of bi-directional drain delay cells, each drain delay cell having a first terminal and a second terminal. The drain delay cells are configured to delay an electrical signal between the first terminal and second terminal by a reconfigurable delay. In some embodiments, each drain delay cell contains an inductor. The drain delay cells are arranged such that each drain delay cell is between the outputs of two gain cells, thereby forming a drain line. The device has a plurality of gate delay cells, each gate delay cell having an input terminal, configured to receive a transmit signal, and an output terminal connected to the input of a corresponding gain cell. The gate delay cells are configured to delay an electrical signal between the input terminal and output terminal by a reconfigurable delay. The device comprises a controller configured to determine a transfer function of the device, and reconfigure the gain of the gain cells and/or the delay of the drain and/or gate delay cells according to the determined transfer function.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Figure 1:
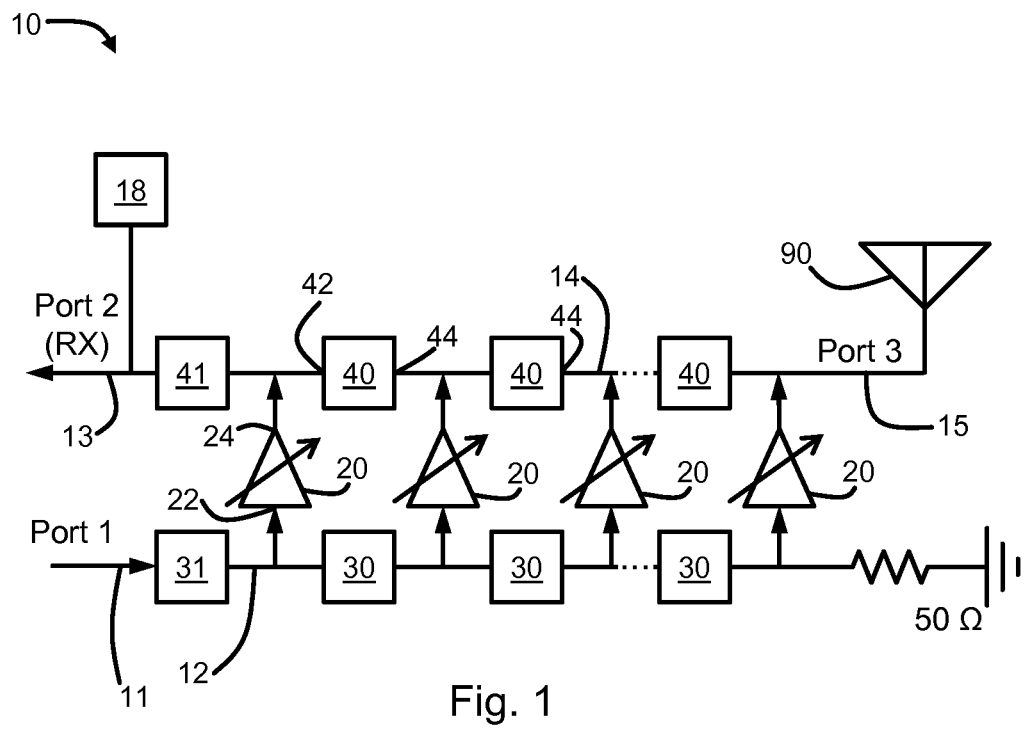
FIG. 1 is a signal processing device according to an embodiment of the present disclosure.

The present disclosure provides a signal processing device 10 that enables bidirectional communication over a single antenna 90 or path. With reference to FIG. 1, the circuit is based upon a distributed amplifier topology with tunable gain cells 20. The forward path through this amplifier (from input (port 1) to output (port 3)) can be configured with high gain and is similar to a typical distributed amplifier in performance. In an embodiment, an input line 12 is constructed as a transmission line or artificial transmission line. The sections between gain cells 20 act as delays 30 by providing some electromagnetic path length at frequencies comparable to the input signal. These signals see another delay 40 on the output transmission line and can be configured to add up in phase when the sum of the delays 30, 40 on each path through each gain cell 20 is equal. A matched antenna can be connected to port 3 for transmission of the amplified signal.

Figure 3A:
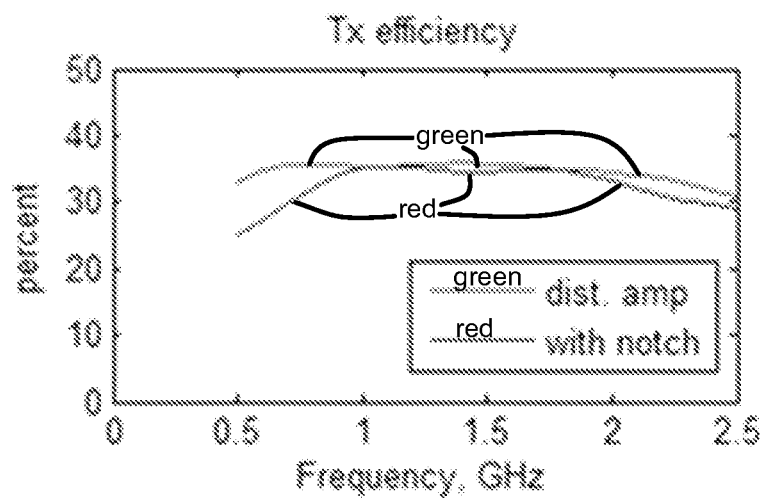
FIG. 3A is a graph depicting the transmit efficiency of a modelled device configured for nulling at the receiver port.
Figure 3B:
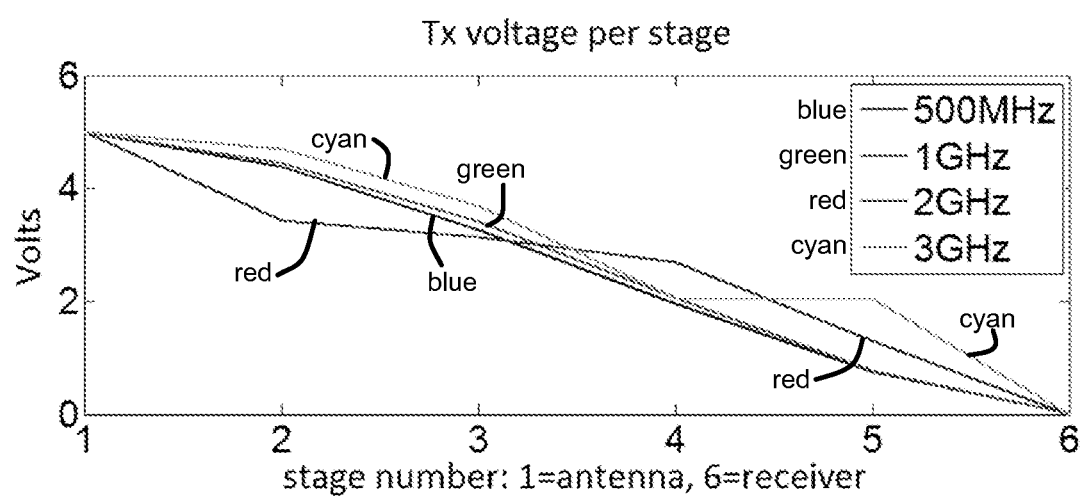
FIG. 3B is a graph depicting the power amplifier output (gain cell output) for a six stage amplifier assuming ideal (perfect in precision) weights from 500 MHz to 3 GHz.

The reverse path from input to the reverse port (port 1 to 2) sees a different signal than the forward path (port 1 to 3). The input signal is delayed on the input line 12, and each delay tap 30 passes through a gain cell 20 before it is then passed through unequal delays 40 again. These gains and delays provide a transfer characteristic of the form:

$$V_{Port3}(t) = A_1 V_{Port1}(t-\tau_1) + A_2 V_{Port1}(t-\tau_2) + \ldots + A_n V_{Port1}(t-\tau_n) \quad (1)$$

where $\tau_n$ is the delay through the nth path, and $A_n$ (which may be a complex number and include a phase shift itself) is the gain of that path. This can be configured as an finite impulse response ("FIR") filter by programming the gain of each gain cell 20 to represent the weights of the filter. The LC sections of the input and output lines represent the delay or sampling time of the filter. The ability to construct this filter on the reverse port, allows this circuit to isolate ports 2 and 3, and thus enable a transmit ("Tx") signal to be sent from port 1 to 3 while a receive ("Rx") signal can propagate from port 3 to 2 without interference. By constructing tunable gain cells 20 with complex weights, both A and z can be defined for each stage, thereby tuning the transfer characteristic from port 1 to port 2 to notch out the transmit signal across a range of frequencies. When two or more stages (weights) are used, both output power summation and notching can be maintained simultaneously, isolating port 2 from the output on port 3. As shown in FIGS. 3A and 3B, configuring weights for both notch and summation may slightly degrade efficiency compared to focusing only on output power. A tunable, interference-resistant receiver can then be used to realize full tunability of both Tx and Rx for cognitive radio and software defined radio ("SDR") applications.

The circuit can be further enhanced by utilizing a technique for tuning the output resistance based on passive mixers (further described below under the heading "Source Degeneration"). Such a realization of the gain cell 20 is advantageous to reduce the noise from the Tx from propagating to the Rx. Furthermore, it enables the shunt impedance of the circuit between ports 3 and 2 to be high at the Rx frequency of interest, reducing loss.

The disclosure may be embodied as a distributed signal processing device 10. Such a signal processing device 10 may be used as a diplexed transceiver. The signal processing device 10 comprises a plurality of gain cells 20. Each gain cell 20 has an input 22 and an output 24, and the gain cell 20 amplifies an electrical signal received at the input 22 by a gain A. The gain is selectable (i.e., reconfigurable) according to the frequency of interest. In this way, if the frequency of interest is changed (i.e., the transmit and/or receive frequency), the gain of the gain cells 20 can be reconfigured. The gain cells 20 may have the same gain, or one or more gain cells 20 may have different gain(s) than those of the other gain cells 20.

The device 10 has a plurality of bi-directional drain delay cells 40. Each drain delay cell 40 has a first terminal 42 and a second terminal 44. The drain delay cells 40 are configured to delay an electrical signal between the first terminal 42 and second terminal 44. It should be noted that the drain delay cells 40 are bi-directional such that an electrical signal received at the first terminal 42 may be delayed to the second terminal 44, and an electrical signal received at the second terminal 44 may be delayed to the first terminal 42. The delay may be fixed. In other embodiments, the delay is selectable (i.e., reconfigurable) according to a frequency of interest. In this way, if the frequency of interest is changed, the delay of the drain delay cells 40 can be reconfigured. The drain delay cells 40 may have the same delay as each other. In some embodiments, one or more drain delay cells 40 may have different delay(s) than those of the other drain delay cells 40. In some embodiments, the drain delay cells 40 have an inductance and a capacitance. For example, each drain delay cell 40 may contain an inductor 46. In some embodiments, each drain delay cell 40 may be configured as an inductor-capacitor pi-network having one or more stages.

The drain delay cells 40 are arranged such that each drain delay cell 40 is between the outputs 24 of two gain cells 20. In other words, the first terminal 42 of each drain delay cell 40 is connected to the output 24 of a gain cell 20, and the second terminal 44 of each drain delay cell 40 is connected to the output 24 of an adjacent gain cell 20. In this way, the drain delay cells 40 may form a string, which can be considered a drain line 14 having an antenna end 15 (i.e., port 3) and a receiver end 13 (i.e., port 2).

The device 10 has a plurality of gate delay cells 30. Each gate delay cell 30 has an input terminal 32 and an output terminal 34. The input terminal 32 of each gate delay cell 30 is configured to receive a transmit signal. The gate delay cells 30 are arranged such that the output terminal 34 of each drain delay cell 30 is connected to the input 22 of a corresponding gain cell 20. The gate delay cells 30 are configured to delay an electrical signal between the input terminal 32 and output terminal 34 by a delay. The delay is selectable (i.e., reconfigurable) according to a frequency of interest. In this way, if the frequency of interest is changed, the delay of the gate delay cells 30 can be reconfigured. The gate delay cells 30 may have the same delay as each other. In some embodiments, one or more gate delay cells 30 may have different delay(s) than those of the other gate delay cells 30. Each gate delay cell 30 may have the same delay as a corresponding drain delay cell 40. In other embodiments, the delays of the gate delay cells 30 may be different than the delays of the drain delay cells 40. It should be noted that the device 10 may include a first gate delay cell 31 at the transmit end 11 (port 1). In such an embodiment, a first drain delay cell 41 can be used to provide the corresponding delay on the drain line 14.

In some embodiments, the gate delay cells 30 are arranged such that each gate delay cell 30 is between the inputs 22 of two gain cells 20. In other words, the input terminal 32 of each gate delay cell 30 is connected to the input 22 of a gain cell 20, and the output terminal 34 of each gate delay cell 30 is connected to the input 22 of an adjacent gain cell 20. In this way, the gate delay cells 30 may form a string, which can be considered a gate line 12 having a transmitter end 11 (i.e., port 1).

Figure 2:
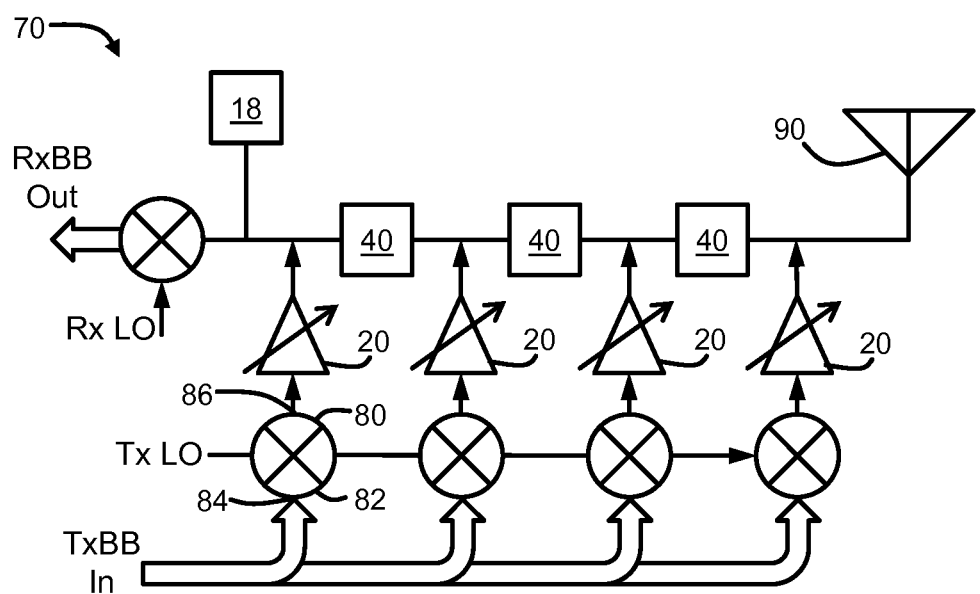
FIG. 2 is a signal processing device according to another embodiment of the present disclosure.

In other embodiments, such as the device 70 depicted in FIG. 2, a gate delay cell 80 comprises an up-conversion mixer 82. Each up-conversion mixer 82 is configured to receive a local oscillator ("Tx LO") signal. Each up-conversion mixer 82 receives a baseband Tx signal ("TxBB") on the input terminal 84 and is configured to up-convert the baseband signal using the Tx LO signal. The resulting up-converted signal is provided at the corresponding output terminal 86. The Tx signal is phase-shifted to effect the delay of the gate delay cells 80. In this way, the up-converted Tx signal output from a second gate delay cell 20 is phase-delayed relative to the up-converted Tx signal output from a first gate delay cell 20, and so on. Such an approach would advantageously avoid physically large passive delay line elements. It should be noted that the term "delay" should be broadly interpreted to include time delay and/or phase delay.

Figure 7:
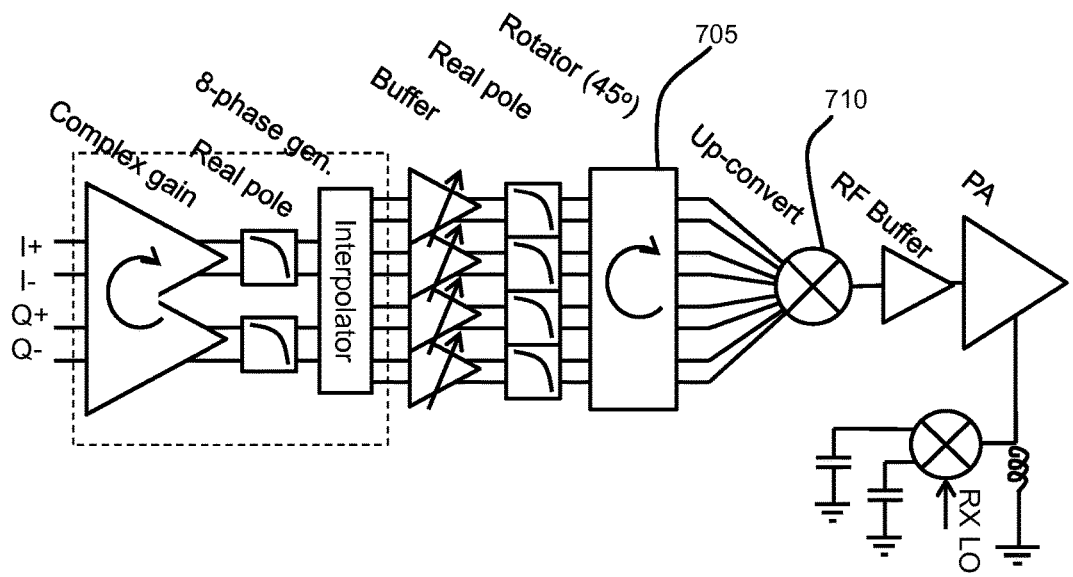
FIG. 7 is a diagram depicting an exemplary gate delay cell(s) and gain cells.

An exemplary gate delay cell is configured to provide a phase delay on the incoming transmit signal (see, e.g., FIG. 7). Such a gate delay cell may comprise a quadrature phase rotator followed by a quadrature mixer for up-conversion of the transmit signal. The transmit mixer may be an 8-phase mixer configured to suppress $3^{rd}$ and $5^{th}$ harmonic upconversion. The baseband transmit signal comprises two independent signals, in-phase and quadrature (I and Q), representing the real and imaginary parts of the desired transmit signal. These are converted to a single high-frequency signal through quadrature up conversion, where I is converted to the cosine part of the high frequency signal, and Q is upconverted to the sine part of the upconverter signal. Effective phase rotation can be realized by appropriately adding a weighted version of the Q signal to the I signal, and a weighted version of the I signal (same magnitude, opposite sign to the previous weight) to the Q signal in baseband before up-conversion.

Other gate delay cell embodiments will be apparent in light of the present disclosure to those having skill in the art, and the present disclosure is intended to include such other embodiments.

The device 10 comprises a controller 18 configured to determine a transfer function of the device 10. The controller 18 is configured to automatically set the gain(s) of each gain cell 20 and/or the delay(s) of the gate and drain delay cells 30, 40 based on the transfer function of the device 10 based on a transmit signal applied at port 1. The controller 18 may be configured to select the gain(s) and or the delay(s) such that the amplified signals from each gain cell 20 are substantially nulled at the receiver end 13 of the drain line 14. In some embodiments, the controller 18 is configured to optimize amplification at the antenna end 15, the null at the receiver end 13, and/or the power consumed by the device 10, 70. This is further described below under the heading "Exemplary Controller Optimization."

It should be noted that by "substantially" nulled at the receiver end 13 should be interpreted broadly to encompass wherein an Rx signal is usable by a receiver at the receiver end 13. For example, the Tx signal should be low enough such that a receiver at the receiver end 13 is not degraded by the Tx signal. In exemplary embodiments, the Tx signal is nulled by 20 dB, 30 dB, 40 dB or more. In addition to the Tx signals, noise may also be a consideration in the Rx signal at the receiver end 13. In some embodiments, Rx-band noise reduction may be 20 dB, 30 dB, 40 dB, or more. Therefore, signals are nulled to a level whereby, in view of the amplified Tx signals from the gain cells 20 and Rx band noise of the device, a useable Rx signal is provided at the receiving end 13.

Although controller 18 is depicted as being in electrical communication with the receiver end 13, it should be understood that controller 18 may further (or alternatively) be connected at one or more other locations of the device 10, 70 dictated only be the desired control result. For example, where amplification at the antenna end 15 is to be maximized, the controller 18 may be in electrical communication with the antenna end 15. In another example, where power utilization is to be reduced, the controller 18 may be configured to measure the power consumed by one or more components, such as, for example, the gain cells 20.

Exemplary Gain Cell—Cascode

Figure 4:
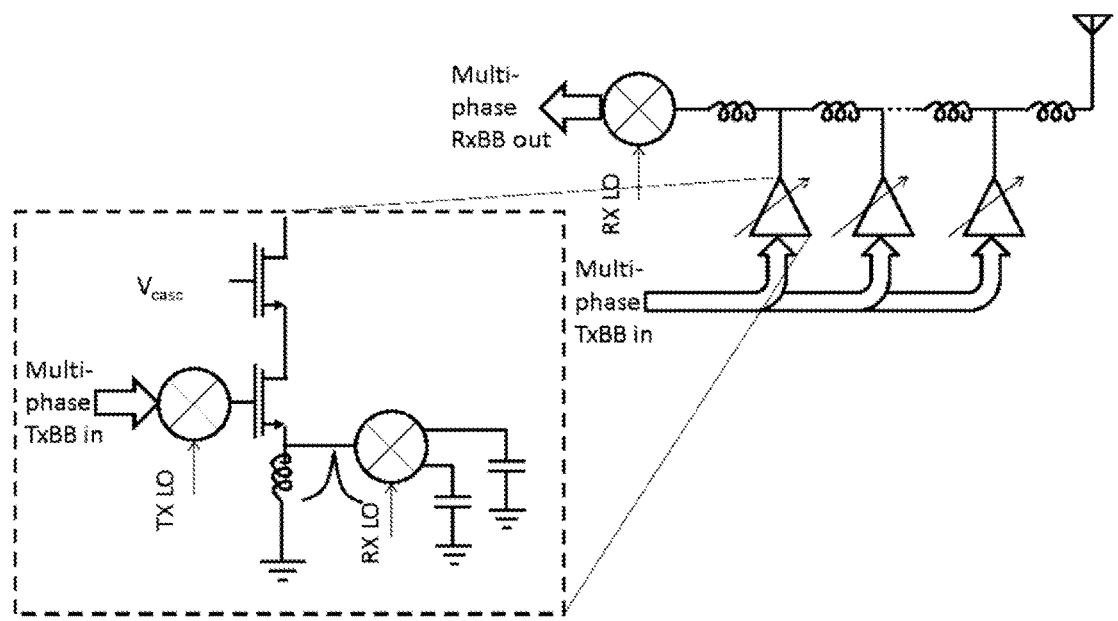
FIG. 4 is a signal processing device showing a detail view of an exemplary gain cell.
Figure 5:
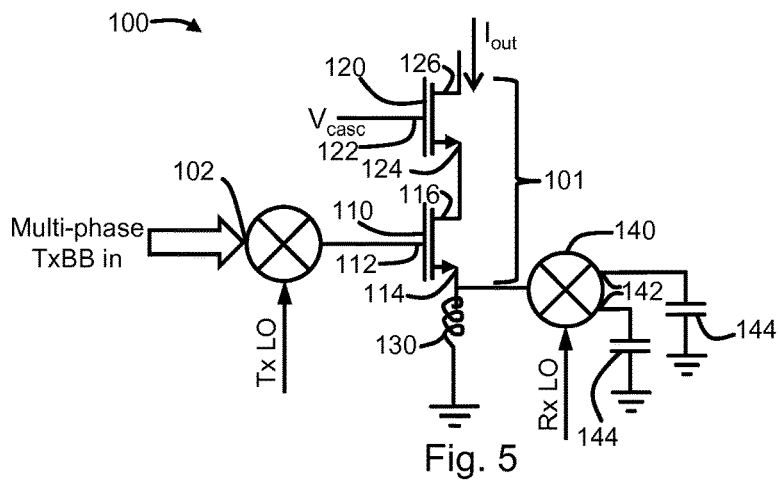
FIG. 5 is an RF amplifier according to another embodiment of the present disclosure.

In some embodiments, for example, the embodiment of FIGS. 4 and 5, each gain cell 100 comprises a cascode 101. As such, each gain cell 100 comprises a common source amplifier 110 containing a cascode device 120. Each of the cascaded common source amplifiers 110 has an input gate, a source, and a drain line output. For example, the amplifiers may be transistors, such as n-channel MOSFETs. The gate 112 of the common source amplifier 110 is in electrical communication with the input terminal 102 of the gate cell 100. The source 114 of the common source amplifier 110 is in electrical communication with a low supply voltage (e.g., ground). The drain 116 of the common source amplifier 110 is in electrical communication with the source 124 of the cascode device 120. The drain 126 of the cascode amplifier 120 makes up the output terminal 104 of the gate cell 100. The gate 122 of the cascode 120 is connected to a bias voltage—the cascode voltage ($V_{casc}$).

In embodiments having multiple cascode devices 120, the cascodes 120 are arranged in series such that the drain of a first 120 is connected to a source of an adjacent device 120. The cascode voltage of each stage is selected to distribute a drain voltage swing across the common source amplifier 110 and cascode device 120 of the cascode amplifier. The cascode voltage of each stacked stage can be selected to distribute the voltage across each amplifier to prevent a transistor from exceeding a breakdown voltage.

Source Degeneration

In some embodiments, the source 112 of the common source amplifier 110 is connected to the low supply voltage by an inductor 130 to provide inductive source degeneration.

In some embodiments, the source 112 of the common source amplifier 110 is further coupled to a passive mixer 140 having a plurality of baseband mixer ports 142 capacitively coupled to the low supply voltage. For example, each baseband mixer port 142 is coupled to the low supply voltage by a corresponding capacitor 144. As such, the passive mixer 140 is configured to downconvert a signal received from the common source amplifier 110 and provide a plurality of baseband signals to a corresponding port of the plurality of baseband mixer ports 142. Each of the baseband signals has a predetermined phase of a plurality of predetermined phases. Because of the capacitive coupling on the baseband ports, only signals close the switching frequency of the mixer 140 (or harmonics thereof) generate significant baseband voltages. The baseband voltages are inherently re-up-converted to the RF port of the mixer 140, presenting an inherently high impedance close to the switching frequency. Because signals at frequencies distant from the switching frequency do not generate significant baseband voltage, these signals experience a low impedance on the RF port of the mixer.

This approach to degeneration provides the ability to tune the degeneration according to the Rx signal. Each passive mixer 140 can be configured to have a switching frequency that is the same as a receiver frequency and/or different from a transmitter frequency. Such an embodiment effectively utilizes pulse-position modulation ("PPM") of the Rx signal for degeneration for the gain cell 100. In this way, a tunable degeneration peak is provided in each gain cell 100, wherein the peak is tuned to the center of the receive band. Although this arrangement may prevent very tight spacing of receive and transmit frequency, it would reduce degradation of the receiver path by noise and loading from the transmitter amplifier stages.

Figure 6:
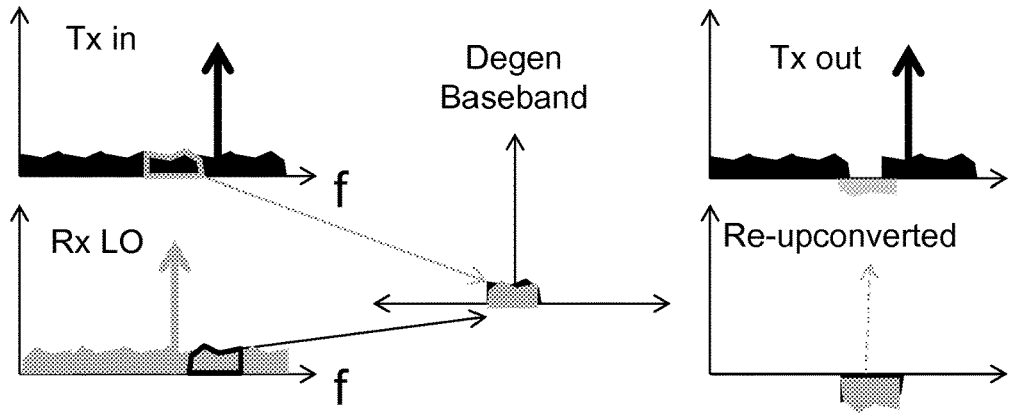
FIG. 6 is a set of graphs depicting the operation of an embodiment of a gain cell wherein source degeneration is provided, in part, by a passive mixer capacitively coupled to a low voltage source.

Because increased degeneration impedance on a common source amplifier reduces its gain. The high impedance of the passive mixer at the receive frequency will tend to suppress receive-band noise on the gate of the common source amplifier from reaching its output (drain). Similarly, since output noise generated by the amplifier itself is reduced with increased degeneration impedance, receive-band noise of the amplifier itself will be suppressed. Finally, because the output impedance of a cascode amplifier is roughly proportional to its degeneration impedance, the passive mixer 140 will cause the amplifier to have a higher output impedance in the receive band. However, the passive mixer 140 can also inject noise due to reciprocal mixing of its local oscillator phase noise by the transmitter signal, as shown in FIG. 6. However, this noise will be mostly correlated across amplifiers, and so may be suppressed at the receiver port in a similar fashion to transmitted signal itself.

Exemplary Controller Optimization

Figure 8:
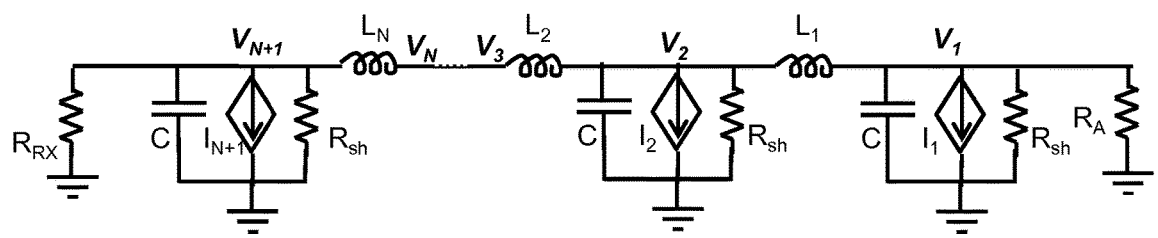
FIG. 8 is a model of an exemplary device according to the present disclosure.

An exemplary optimization scheme for a controller is shown through the following analysis. With reference to FIG. 8, a device is modeled as having N+1 nodes, each with a power amplifier current (I), a shunt resistor ($R_{sh}$), and a shunt capacitor (C) (see FIG. 8). The nodes are coupled by inductors (L) with finite Q (modelled as series R). Using KCL:

For nodes: $1 < i < N+1$:
$$0 = I_i + V_i\left(j\omega C + \frac{1}{R_{sh}}\right) + \frac{2V_i - V_{i-1} - V_{i+1}}{\omega L\left(j + \frac{1}{Q}\right)} \quad (2)$$

Node 1:
$$0 = I_1 + V_1\left(j\omega C + \frac{1}{R_{sh}} + \frac{1}{R_A}\right) + \frac{V_1 - V_2}{\omega L\left(j + \frac{1}{Q}\right)} \quad (3)$$

Node N+1:
$$0 = I_{N+1} + V_{N+1}\left(j\omega C + \frac{1}{R_{sh}} + \frac{1}{R_{RX}}\right) + \frac{V_{N+1} - V_N}{\omega L\left(j + \frac{1}{Q}\right)} \quad (4)$$

I and V can be expressed as vectors of length N+1 as:

$$\vec{i} = \begin{pmatrix} I_1 \\ I_2 \\ \vdots \\ I_{N+1} \end{pmatrix}, \quad (5)$$

$$\vec{v} = \begin{pmatrix} V_1 \\ V_2 \\ \vdots \\ V_{N+1} \end{pmatrix}. \quad (6)$$

By KCL, expressions (5) and (6) can be related by square matrix Y such that $0 = \vec{i} + Y\vec{v}$, where entries in Y are 0, except:

$$y_{ii} = j\omega C + \frac{1}{R_{sh}} + \frac{2}{\omega L(j + 1/Q)} \quad (7)$$

$$y_{i,i-1} = \frac{1}{\omega L(j + 1/Q)}$$

$$y_{i,i+1} = \frac{1}{\omega L(j + 1/Q)} \quad \text{and:}$$

$$y_{11} = j\omega C + \frac{1}{R_{sh}} + \frac{1}{R_A} + \frac{1}{\omega L(j + 1/Q)}$$

$$y_{N+1,N+1} = j\omega C + \frac{1}{R_{sh}} + \frac{1}{R_{Rx}} + \frac{1}{\omega L(j + 1/Q)}$$

This can be reframed as an impedance matrix:

$$\vec{i} = -Y\vec{v} \rightarrow \vec{v} = -Z\vec{i}, Z = Y^{-1} \quad (8)$$

In the present example, the goals of the controller are to optimize the device: (1) to minimize the signal at the receiver end ($V_{N+1}=0$); (2) to achieve a design value for the signal at the antenna port ($V_1 = V_{out} = \sqrt{P_{out} R_A}$); and (3) to minimize the amplifier power ($\vec{i} \rightarrow$ minimum).

$$\begin{pmatrix} V_{out} \\ 0 \end{pmatrix} = \begin{pmatrix} V_1 \\ V_{N+1} \end{pmatrix} = \begin{bmatrix} 1 & \cdots & 0 \\ 0 & \cdots & 1 \end{bmatrix} \vec{v} = -\begin{bmatrix} 1 & \cdots & 0 \\ 0 & \cdots & 1 \end{bmatrix} Z\vec{i} \quad (9)$$

By defining X as a two by N+1 impedance matrix, $\vec{i}$ can be found with pseudo-inverse:

$$X = -\begin{bmatrix} 1 & \cdots & 0 \\ 0 & \cdots & 1 \end{bmatrix} Z, \begin{pmatrix} V_{out} \\ 0 \end{pmatrix} = X\vec{i} \rightarrow \vec{i} = X^*(XX^*)^{-1}\begin{pmatrix} V_{out} \\ 0 \end{pmatrix} \quad (10)$$

Which meets the three goals for the controller.

To consider nulling Rx-band noise, an issue presents because matrix Z is a function of frequency (i.e., $Z(j\omega)$). To this point, set $$X = \begin{bmatrix} \overrightarrow{z_{1(\omega_{TX})}} \\ \overrightarrow{z_{N(\omega_{TX})}} \end{bmatrix},$$

where $\overrightarrow{z_{1(\omega_{TX})}}$ is the $i^{th}$ row of $Z(j\omega_{TX})$.

Then, nulling of Rx-band phase noise can be determined by defining $$X = \begin{bmatrix} \overrightarrow{z_{1(\omega_{TX})}} \\ \overrightarrow{z_{N(\omega_{TX})}} \\ \overrightarrow{z_{N(\omega_{RX})}} \end{bmatrix},$$

and solving $$\vec{i} = X^*(XX^*)^{-1} \begin{pmatrix} V_{out} \\ 0 \\ 0 \end{pmatrix}.$$

In a further example, co-optimization can also be framed as a convex optimization problem, where the controller may determine parameters to minimize three squared errors and current squared:

$V_{out} - \overrightarrow{z_{1(\omega_{TX})}} \cdot \vec{i}$  Error 1:

$0 - \overrightarrow{z_{N(\omega_{TX})}} \cdot \vec{i}$,  Error 2:

$0 - \overrightarrow{z_{N(\omega_{RX})}} \cdot \vec{i}$,  Error 3:

Current: $\vec{i}$

Each term can be weighted by a constant ($k_1$-$k_4$) and the problem can be written as:

$$\min_{\vec{i}} \big(k_1(V_{out} - \overrightarrow{z_{1(\omega_{TX})}} \cdot \vec{i})^2 + \quad (11)$$
$$k_2(0 - \overrightarrow{z_{N(\omega_{TX})}} \cdot \vec{i})^2 + k_3(0 - \overrightarrow{z_{1(\omega_{TX})}} \cdot \vec{i})^2 + k_4(\vec{i} \cdot \vec{i})\big)$$

This is an $L_2$ minimization:

$$E = \min_{\vec{i}} \left( \left\| \begin{pmatrix} k_1 V_{out} \\ 0 \\ 0 \end{pmatrix} - \begin{bmatrix} \overrightarrow{k_1 z_{1(\omega_{TX})}} \\ \overrightarrow{k_2 z_{N(\omega_{TX})}} \\ \overrightarrow{k_3 z_{N(\omega_{RX})}} \end{bmatrix} \vec{i} \right\|_2^2 + k_4 \|\vec{i}\|_2^2 \right) = \quad (12)$$

$$\min_{\vec{i}} \big( \|\vec{v} - A\vec{i}\|_2^2 + k_4 \|\vec{i}\|_2^2 \big)$$

As such, E will be minimum when the gradient is zero:

$$\vec{0} = \begin{pmatrix} \delta E/\delta i_1 \\ \vdots \\ \delta E/\delta i_N \end{pmatrix} = -A^*\vec{v} + A^*A\vec{i} + k_4 I\vec{i} \quad (13)$$

Then $\vec{i} = (A^*A + k_4 I)^{-1} A^* \vec{v}$.

Other control techniques for the controller will be apparent in light of the present disclosure and are within the scope of this disclosure.

Figure 9:
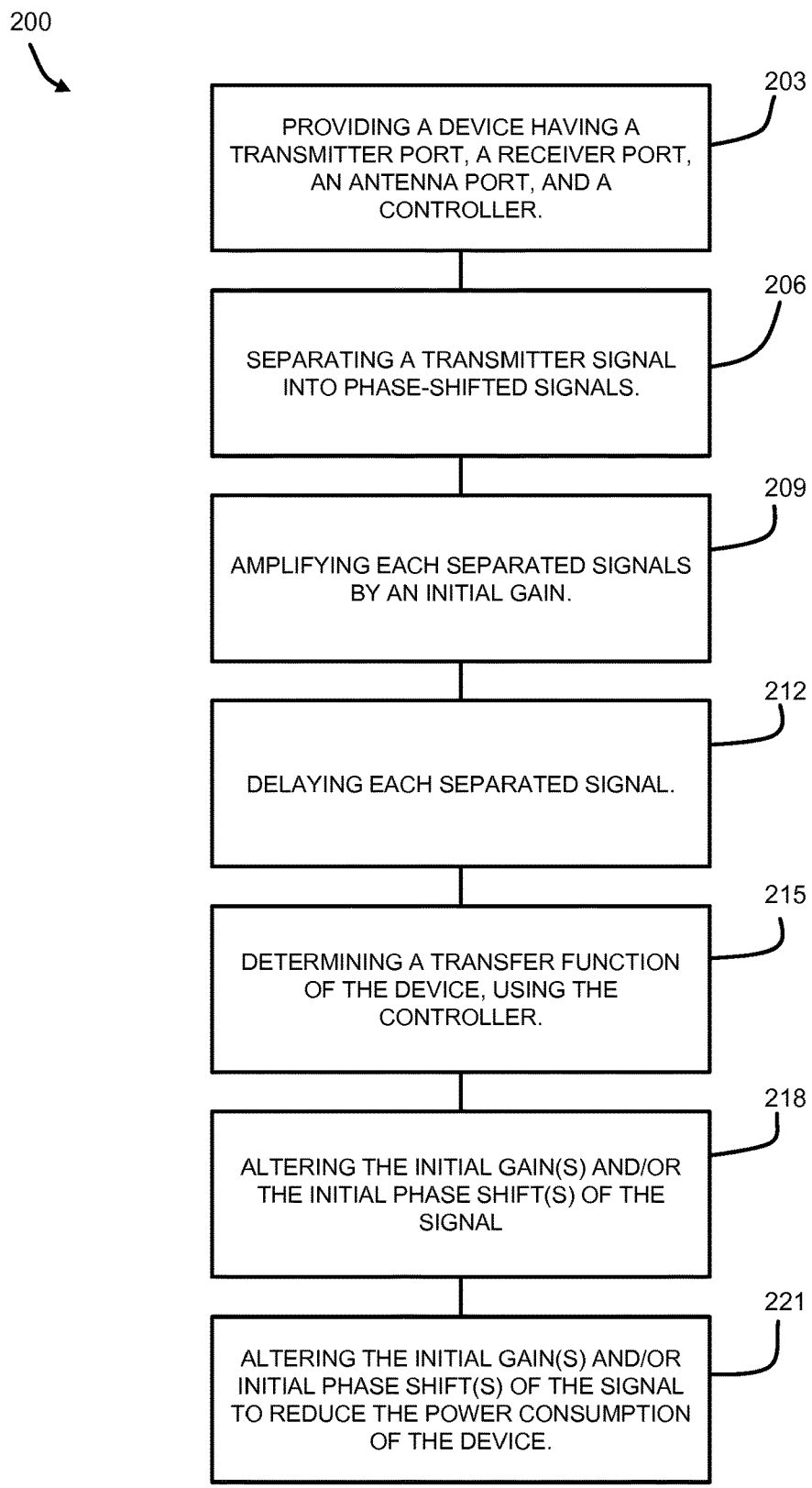
FIG. 9 is a flowchart depicting a method according to an embodiment of the present invention.

The present disclosure may be embodied as a method 200 for automatic configuration of a signal processing device (see, e.g., FIG. 9). The method 200 comprises the step of providing 203 a device having a transmitter port, a receiver port, an antenna port, and a controller. A signal, received at the transmitter port, is separated 206 into phase-shifted signals. The signal may be separated using a quadrature phase rotator as described above. Other ways of separating the signal will be apparent in light of the present disclosure. Each of the separated signals is amplified 209. The signals are amplified 209 by an initial gain. The amplified signals are delayed 212 such that the amplified signals are summed at the antenna port. The initial gain and/or the initial phase shift may be predetermined.

The controller determines 215 a transfer function of the device. For example, the controller may determine 215 a transfer function from the transmitter port to the receiver port. In other embodiments, the controller may determine a transfer function from the transmitter port to the antenna port. Other transfer functions may be determined according to the design parameters of a particular device. More than one transfer function may be determined 215. The controller may determine 215 a transfer function by measuring a signal at one or more points of the device. For example, the controller may measure a signal at the receiver port and a signal at the antenna port. The controller automatically alters 218 the initial gain and/or the initial phase shift of the signal according to the determined transfer function. In some embodiments, the controller may alter 218 the gain and/or the phase shift such that the signals substantially null at the receiver port. In some embodiments, the controller may alter 218 the gain and/or the phase shift such that the signals provide a desired amplification at the antenna port.

In some embodiments, the controller may measure 221 the power consumption of one or more components of the device. In such embodiments, the controller can alter 224 the gain and/or phase shift to reduce power consumption of the device (e.g., increase efficiency). In this way, the transfer functions and power consumption may be optimized for a particular device and signal.

Although the present disclosure has been described with respect to one or more particular embodiments, it will be understood that other embodiments of the present disclosure may be made without departing from the spirit and scope of the present disclosure. Hence, the present disclosure is deemed limited only by the appended claims and the reasonable interpretation thereof.

What is claimed is:

1. A reconfigurable distributed signal processing device, comprising:
   a plurality of gain cells, each gain cell having an input and an output, and wherein each gain cell is configured to amplify an electrical signal received at the input by a gain;
   a plurality of drain delay cells, each drain delay cell having an first terminal and an second terminal, wherein each drain delay cell is configured to delay an electrical signal between the first and second terminals by a delay, and wherein each drain delay cell is disposed between the outputs of two gain cells such that the drain delay cells form a drain line having a receiver end and an antenna end;
   a plurality of gate delay cells, each gate delay cell having an input terminal for a transmit signal and an output terminal in electrical communication with the input of a corresponding gain cell, wherein each gate delay cell is configured to delay an electrical signal between the input and output terminals by delay; and a controller configured to determine a transfer function of the device for automatic selection of the gains of the gain cells and/or the delays of the drain and gate delay cells such that the amplified signals from each gain cell are substantially nulled at the receiver end of the drain line and amplified at the antenna end of the drain line.

2. The device of claim 1, wherein the delay of each gate delay cell is the same as the delay of a corresponding drain delay cell.

3. The device of claim 1, wherein the delay of each gate delay cell is different from the delay of a corresponding drain delay cell.

4. The device of claim 1, wherein each gate delay cell comprises a transmit mixer configured to upconvert the transmit signal.

5. The device of claim 4, wherein the transmit mixer is an 8-phase mixer configured to suppress $3^{rd}$ and $5^{th}$ harmonic upconversion.

6. The device of claim 4, wherein each gate delay cell comprises a quadrature phase rotator and the transmit mixer is configured for quadrature upconversion.

7. The device of claim 1, wherein each gate delay cell is disposed between the inputs of two gain cells such that the gate delay cells form a gate line having a transmitter end.

8. The device of claim 1, wherein each drain delay cell has an inductance and a capacitance.

9. The device of claim 8, wherein each drain delay cell comprises an inductor.

10. The device of claim 8, wherein each drain delay cell comprises an inductor-capacitor pi-network having one or more stages.

11. The device of claim 1, wherein each gain cell comprises a cascode having a common source amplifier in electrical communication with one or more common gate amplifiers.

12. The device of claim 11, wherein the one or more common gate amplifiers are configured to distribute a drain voltage swing across the common source amplifier and common gate amplifier(s) of the cascode.

13. The device of claim 11, wherein a source terminal of each common source amplifier is connected to a low supply voltage by way of a corresponding inductor.

14. The device of claim 13, wherein the low supply voltage is ground.

15. The device of claim 14, wherein the source terminal of each common source amplifier is further coupled to a corresponding passive mixer, each passive mixer having a plurality of baseband mixer ports capacitively coupled to ground, wherein each passive mixer is configured to downconvert a signal received from the common source amplifier and provide a plurality of baseband signals to a corresponding port of the plurality of baseband mixer ports, each baseband signal having a predetermined phase of a plurality of predetermined phases.

16. The device of claim 15, wherein a switching frequency of each passive mixer is different from the frequency of a transmission frequency.

17. The device of claim 16, further comprising a receiver in electrical communication with the receiver end of the drain line, and wherein the switching frequency of each passive mixer is the same as a receiver frequency.

18. The device of claim 1, wherein, for an applied transmit signal, the controller is configured to optimize amplification at the antenna end, the null at the receiver end, and the power consumed by the device.

* * * * *